United States Patent [19]

Takechi

[11] Patent Number: 4,851,958
[45] Date of Patent: Jul. 25, 1989

[54] SUPERCONDUCTING ELECTROMAGNET APPARATUS

[75] Inventor: Moriaki Takechi, Hyogo, Japan

[73] Assignee: Mitsubishi Denki Kabushiki Kaisha, Japan

[21] Appl. No.: 194,518

[22] Filed: May 16, 1988

[30] Foreign Application Priority Data

May 18, 1987 [JP] Japan .................... 62-118972

[51] Int. Cl.$^4$ ........................... H01H 47/00
[52] U.S. Cl. .................... 361/141; 335/216
[58] Field of Search .......... 361/141, 19; 335/216; 324/320, 322

[56] References Cited

U.S. PATENT DOCUMENTS 3,419,904 12/1968 Weaver et al. .................. 361/141

FOREIGN PATENT DOCUMENTS 60-123756 7/1985 Japan .
8330198 11/1983 United Kingdom .
8400684 1/1984 United Kingdom .

Primary Examiner—L. T. Hix
Assistant Examiner—David M. Gray
Attorney, Agent, or Firm—Leydig, Voit & Mayer

[57] ABSTRACT

A superconducting electromagnet apparatus wherein a superconducting main coil and a superconducting shield coil for reducing external magnetic field leakage from the main coil are connected in series, a magnetizing power source is connected across the series connection assembly, and persistent current switches are respectively connected in parallel with the main coil and the shield coil.

3 Claims, 5 Drawing Sheets

000
SUPERCONDUCTING ELECTROMAGNET APPARATUS

BACKGROUND OF THE INVENTION

1. Field of the Invention

This invention relates to a superconducting electromagnet apparatus, and more particularly to a superconducting electromagnet apparatus for use in a magnetic resonance imaging system.

2. Description of the Prior Art

In general, an electromagnet for a magnetic resonance imaging system needs to generate a highly intense and homogeneous magnetic field in an imaging space within the opening of the electromagnet. When generating such a magnetic field, a superconducting electromagnet apparatus in the prior art has a problem in that the magnetic field leaks outside the electromagnet to adversely affect peripheral equipment. It is therefore desirable that the magnetic field leakage be reduced by subjecting the electromagnet to magnetic shielding.

An expedient for the magnetic shielding of the electromagnet is a method in which the electromagnet is surrounded with a magnetic substance. This method, however, has the disadvantage that the weight of the apparatus increases so that high load bearing strength is required at the place of installation. For this reason, a method is employed in which a coil for generating a magnetic field opposite in polarity to that of the main coil is disposed around the main coil.

FIG. 1 is a sectional view showing the construction of an electromagnet which is used in the prior-art superconducting electromagnet apparatus stated above. A superconducting main coil (hereinbelow, simply termed "main coil") 1 and a superconducting shield coil (hereinbelow, simply termed "shield coil") 2, which is disposed around the main coil 1 and which reduces external magnetic field leakage generated by the main coil 1, are housed in an inner vessel 3 and are cooled to and held at a cryogenic temperature. The inner vessel 3 is further enclosed within a vacuum vessel 4 for the purpose of vacuum thermal insulation. A thermally-insulating shield 5 is interposed between the inner vessel 3 and the vacuum vessel 4.

FIG. 2 is an electric connection diagram of the prior-art superconducting electromagnet apparatus. The main coil 1 and the shield coil 2 are connected in series, and a persistent current switch 6 is connected in parallel with the series connection assembly. The resulting parallel connection assembly is connected to a magnetizing power source 10 through current leads 7, detachable current leads 8 and current leads 9. The persistent current switch 6 is combined with a heater 11, which is connected to a heater power source 14 through current leads 12, detachable current leads 8 and current leads 13.

In such a superconducting electromagnet apparatus, the shield coil 2 establishes a homogeneous resultant magnetic field in the internal operating space of the electromagnet in superposition with a magnetic field generated by the main coil 1. Shield coil 2 also generates an external magnetic field opposite in polarity to the external magnetic field leakage generated by the main coil 1, thereby to reduce the resultant magnetic field combined with the magnetic field of the main coil 1.

In magnetizing the electromagnet, the detachable current leads 8 are attached to connect the magnetizing power source 10 and the heater power source 14. The heater 11 is energized by the heater power source 14 to open the persistent current switch 6, whereby the main coil 1 and shield coil 2 connected in series are supplied with current from the magnetizing power source 10. After the current has reached a predetermined value, the persistent current switch 6 is closed. Then, the main coil 1 and the shield coil 2 form a series closed circuit, so that a persistent current operation is performed.

With the prior-art superconducting electromagnet apparatus shown in FIG. 2, since the main coil 1 and the shield coil 2 are connected in series, the conduction currents thereof are equal, and the homogeneous resultant magnetic field must to be established in the internal operating space of the electromaget with the identical current. Therefore, such an apparatus has problems in that the size of the conductors and the shapes of the coils are limited making it uneconomical.

In order to relieve this problem, a superconducting electromagnet apparatus as shown in FIG. 3 has been employed. In this superconducting electromagnet apparatus, a persistent current switch 6a is connected in parallel with the main coil 1, and it is combined with a heater 11a. Further, the main coil 1 is also connected to a magnetizing power source 10a through current leads 7a, detachable current leads 8 and current leads 9a, while the heater 11a is connected to a heater power source 14a through current leads 12a, detachable current leads 8 and current leads 13a. Likewise, a persistent current switch 6b is connected in parallel with the shield coil 2, and it is combined with a heater 11b. Further, the shield coil 2 is also connected to a magnetizing power source 10b through current leads 7b, detachable current leads 8 and current leads 9b, while the heater 11b is connected to a heater power source 14b through current leads 12b, detachable current leads 8 and current leads 13b.

With the superconducting electromagnet apparatus in FIG. 3, the main coil 1 and the shield coil 2 are electrically independent of each other and have independent magnetizing circuits, so that they can be operated with currents different from each other. This superconducting electromagnet apparatus, however, has two problems. Since current leads are required for the two circuits for the main coil and for the shield coil, the number of internal circuits for the detachable current leads 8 increases, increasing the size of the apparatus. Also, two magnetizing power sources are required instead of the single source as in FIG. 2.

As thus far described, the prior-art super-conducting electromagnet apparatus has had the problems of being uneconomical due to the limitations on the sizes of conductors and the shapes of the coils or the problems of being too large and requiring two magnetizing power sources.

SUMMARY OF THE INVENTION

This invention has been made in order to solve the problems as mentioned above, and has for its object to provide a superconducting electromagnet apparatus which need not equalize the currents of a main coil and a shield coil and which can magnetize an electromagnet with a single magnetizing power source.

The superconducting electromagnet apparatus according to this invention comprises a main coil and a shield coil serially connected to each other and to which persistent current switches are respectively connected in parallel, the magnetizing power source being connected across the series connection assembly.

In this invention, the persistent current switches are respectively connected in parallel with the main coil and the shield coil, so that the main coil and the shield coil form independent closed circuits and can be brought into persistent current operations with currents different from each other. In addition, the main coil and the shield coil are connected in series, and the magnetizing power source is connected across the series connection assembly, so that the main coil and the shield coil can be energized to current values different from each other with the single magnetizing power source by the operation of opening and closing the persistent current switches.

DESCRIPTION OF THE PREFERRED EMBODIMENT

Now, an embodiment of this invention will be described with reference to the accompanying drawings.

Figure 4:
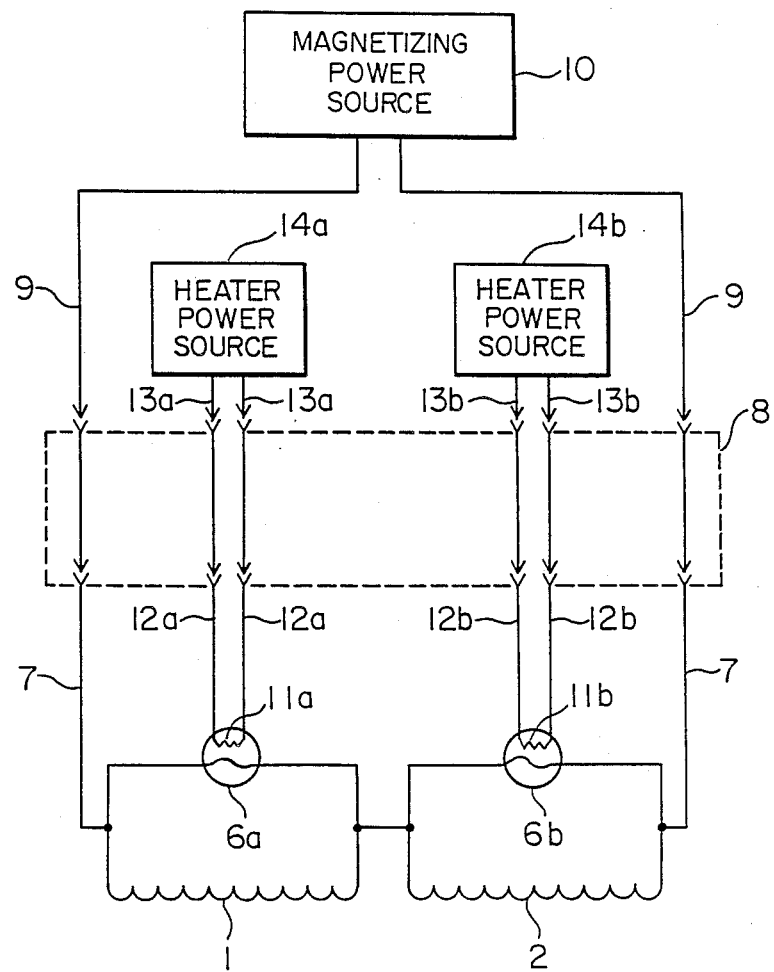
FIG. 4 is an electrical connection diagram of an embodiment of this invention.

FIG. 4 is an electrical connection diagram showing one embodiment of this invention. A main coil 1 and a shield coil 2 are connected in series with each other, and a persistent current switch 6a is connected in parallel with the main coil 1, while a persistent current switch 6b is connected in parallel with the shield coil 2. The persistent current switches 6a and 6b are respectively combined with heaters 11a and 11b. The series connection assembly of the main coil 1 and the shield coil 2 is connected to a magnetizing power source 10 through current leads 7, detachable current leads 8 and current leads 9. The heater 11a combined with the persistent current switch 6a is connected to a heater power source 14a through current leads 12a, detachable current leads 8 and current leads 13a. Likewise, the heater 11b combined with the persistent current switch 6b is connected to a heater power source 14b through current leads 12b, detachable current leads 8 and current leads 13b.

Further, the shield coil 2 establishes a homogeneous resultant magnetic field in superposition with a magnetic field generated in the internal space of an electromagnet by the main coil 1. Shield coil 2 generates a magnetic field opposite in polarity to a magnetic field established in the external space of the electromagnet by the main coil 1, thereby reducing the external magnetic field leakage. In addition, although both the main coil 1 and the shield coil 2 are illustrated as single solenoid coils, they are usually constructed of a plurality of coils in order to establish the homogeneous magnetic field (which is necessary for magnetic resonance imaging) in the operating space inside the electromagnet.

Figure 5A:
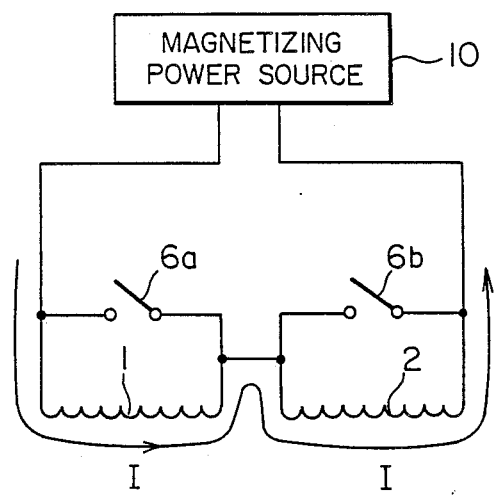
FIGS. 5A and 5B are circuit diagrams for explaining a method of magnetizing the embodiment shown in FIG. 4.
Figure 5B:
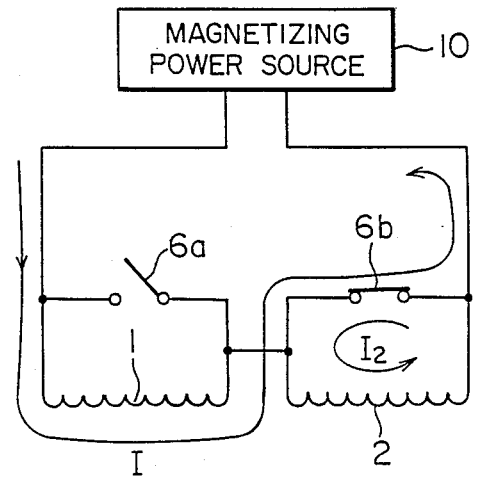

Next, the method of magnetizing the super-conducting electromagnet apparatus according to this invention will be described with reference to FIGS. 4, 5A and 5B. In order to facilitate description of the invention, it is assumed that $I_1 > I_2$ where $I_1$ denotes the operating current of the main coil 1, and $I_2$ that of the shield coil 2. However, even if $I_1 \leq I_2$ holds, the object of this invention can still be accomplished.

First, the detachable current leads 8 are attached to the superconducting electromagnet apparatus to connect the magnetizing power source 10 and the heater power sources 14a, 14b, thereby to form the circuit arrangement in FIG. 4. The heaters 11a and 11b are respectively energized by the heater power sources 14a and 14b, to open the persistent current switches 6a and 6b and to supply the main coil 1 and the shield coil 2 with current from the magnetizing power source 10. Under this state, the same current I flows into the main coil 1 and the shield coil 2 as illustrated in FIG. 5A.

Figure 1:
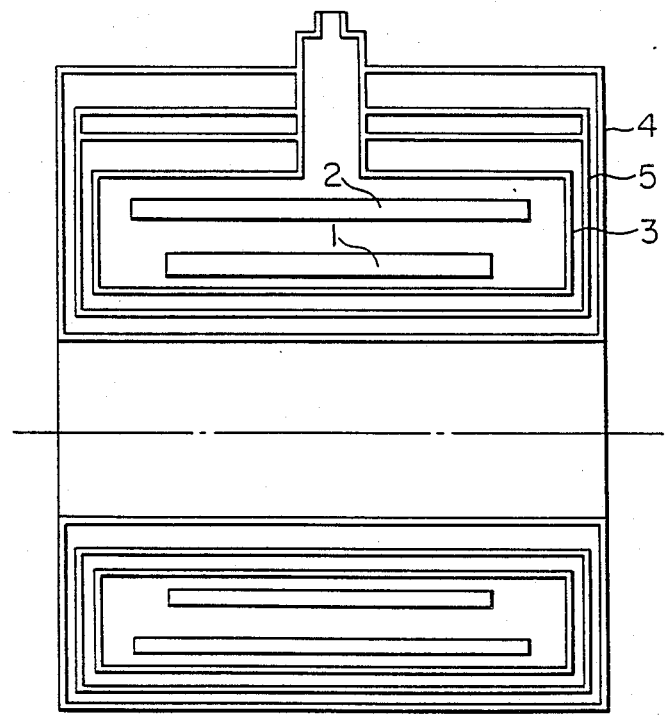
FIG. 1 is a sectional view showing the construction of an electromagnet.
Figure 2:
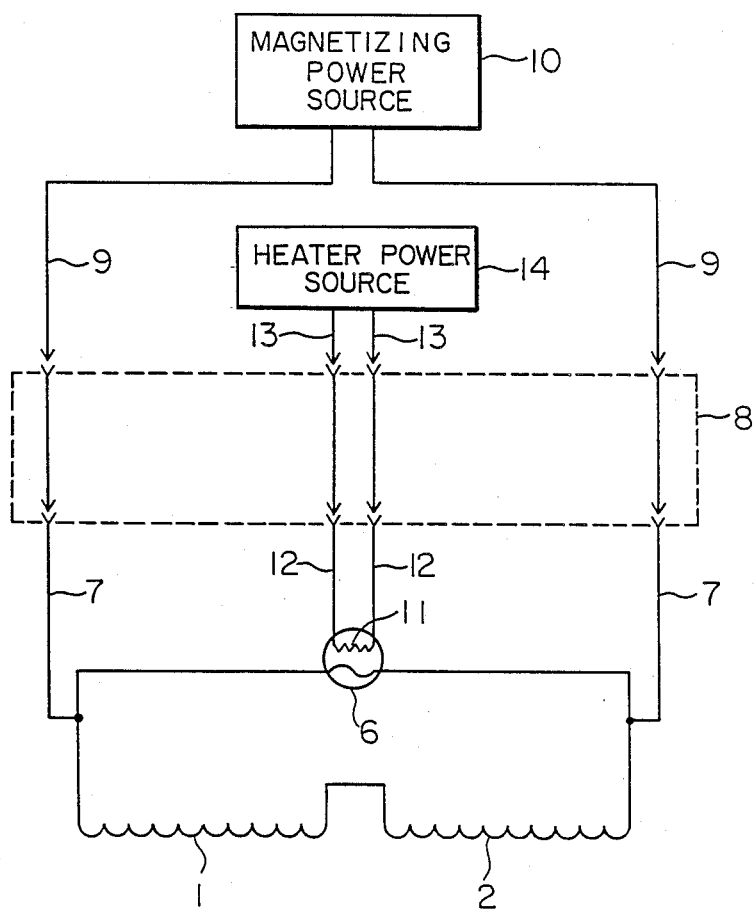
FIG. 2 is an electrical connection diagram of a prior-art superconducting electromagnet apparatus.
Figure 3:
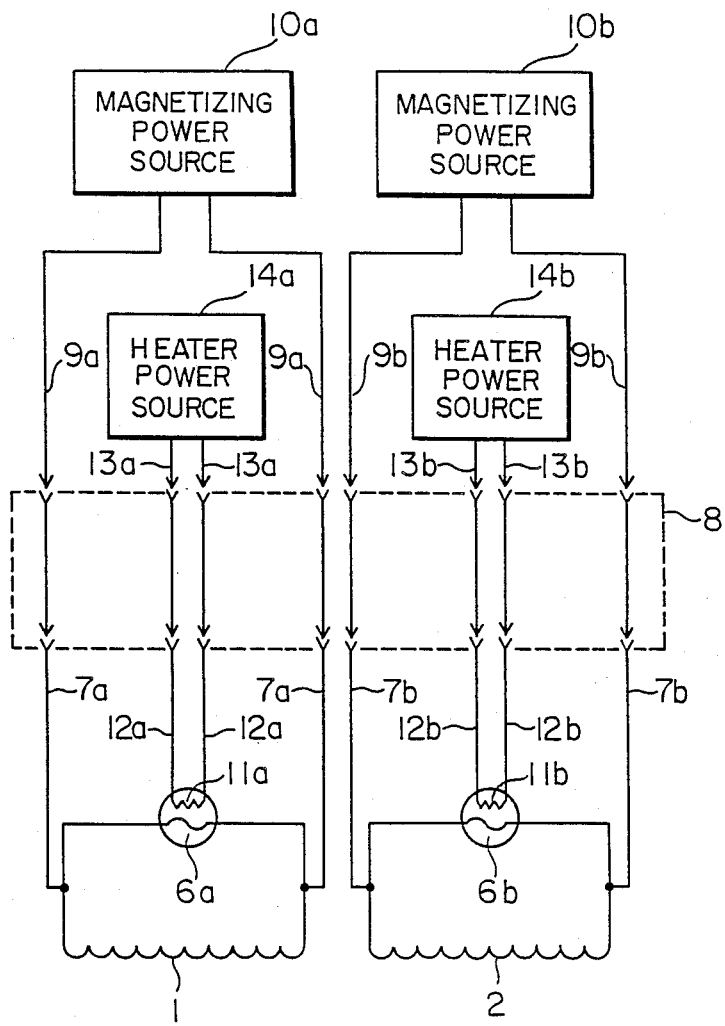
FIG. 3 is an electrical connection diagram of another prior-art superconducting electromagnet apparatus.

When the current has reached $I_2$, the energization of the heater 11b of the persistent current switch 6b connected in parallel with the shield coil 2 is stopped to close the persistent current switch 6b. Then, the current which is fed from the magnetizing power source 10 bypasses the shield coil 2 and flows only into the main coil 1 as illustrated in FIG. 5B. After the current of the main coil 1 has reached $I_1$, the energization of the heater 11a of the persistent current switch 6a connected in parallel with the main coil 1 is stopped. Then, the persistent current switch 6a is closed, and the main coil 1 and the shield coil 2 form superconducting closed circuits owing to the persistent current switches 6a and 6b connected in parallel with the respective coils, so that the apparatus is operated in a persistent current mode. Although the main coil 1 and the shield coil 2 are connected in series, they can be operated with unequal currents during normal operation because they form the separate closed circuits owing to the persistent current switches 6a and 6b, respectively. In addition, according to this arrangement, one set of leads suffices for the current leads 7 etc. and the magnetizing power source 10. The apparatus can be reduced in cost as compared with the apparatus of FIG. 3 in which current leads and a magnetizing power source are respectively disposed for both the main coil 1 and the shield coil 2.

As described above in detail, the main coil and the shield coil can be operated with unequal currents, since persistent current switches are respectively connected in parallel with a main coil and a shield coil, the apparatus can be fabricated inexpensively, since an electromagnet can be energized by a single magnetizing power source, and a magnetic shielding effect based on the shield coil can be varied since the operating current of the shield coil can be set at will.

What is claimed is:

1. A superconducting electromagnet apparatus comprising a superconducting main coil, a superconducting shield coil connected in series with said main coil for reducing external magnetic field leakage from said main coil, a single magnetizing power source for supplying current to the series connection of said main coil and said shield coil, a first persistent current switch connected in parallel with said main coil, a second persistent current switch connected in parallel with said shield coil, and means for independent actuation of said first and second persistent current switches, whereby different currents, both produced by said single magnetizing power source, can be made to flow through said series connected superconducting main and shield coils.

2. A superconducting electromagnet apparatus according to claim 1 wherein each of said first and second persistent current switches includes a heater and a heater power source connected across said heater.

3. A method of reducing the magnetic field leakage from a superconducting main coil with a superconducting shield coil electrically connected in series with the main coil, the coils including main and shield persistent switches connected in parallel with the respective coils, comprising:

opening main and shield persistent switches connected respectively in parallel with series connected main and shield superconducting coils;

establishing a current of a first magnitude flowing through said main and shield coils from a single magnetizing power source;

closing one of said persistent current switches;

establishing a second magnitude current, different from said first magnitude current, flowing from the single magnetizing power source through the coil connected in parallel with the open persistent current switch;

closing the open persistent current switch; and terminating the current flow from the single magnetizing power source to said main and shield coils.

* * * * *